United States Patent [19]
Duerr et al.

[11] Patent Number: 6,131,396
[45] Date of Patent: *Oct. 17, 2000

[54] HEAT RADIATION SHIELD, AND DEWAR EMPLOYING SAME

[75] Inventors: Wilhelm Duerr; Markus Vester, both of Erlangen, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/938,886

[22] Filed: Sep. 26, 1997

[30] Foreign Application Priority Data

Sep. 27, 1996 [DE] Germany .............. 196 39 924

[51] Int. Cl.⁷ ........................................ F25B 19/00
[52] U.S. Cl. ........................... 62/51.1; 62/DIG. 13
[58] Field of Search ..................... 62/45.1, 51.1, 62/DIG. 13

[56] References Cited

U.S. PATENT DOCUMENTS

| | | | |
|---|---|---|---|
| 3,007,596 | 11/1961 | Matsch | 62/DIG. 13 |
| 3,018,016 | 1/1962 | Hnilicka, Jr. | 62/DIG. 13 |
| 4,819,450 | 4/1989 | Miller | 62/51.1 |
| 5,065,582 | 11/1991 | Seifert | 62/51.1 X |
| 5,226,299 | 7/1993 | Moiseev | 62/45.1 |
| 5,651,256 | 7/1997 | Herd et al. | 62/51.1 |

*Primary Examiner*—Christopher B. Kilner
*Attorney, Agent, or Firm*—Hill & Simpson

[57] ABSTRACT

A heat radiation shield has an electrically insulating support on which a mosaic of electrically conductive elementary layers is arranged on at least one side.

13 Claims, 2 Drawing Sheets

HEAT RADIATION SHIELD, AND DEWAR EMPLOYING SAME

BACKGROUND OF THE INVENTION

1. Field of the Invention

The present invention is directed to a heat radiation shield and to a Dewar incorporating such a heat radiation shield therein.

2. Description of the Prior Art

In diagnostic nuclear magnetic resonance low field systems with correspondingly low frequencies of the nuclear magnetic resonance signals, the transmission and reception antennas for the excitation and reception of the nuclear magnetic resonance signals are attenuated only slightly by the body of a patient. There is an increasing number of applications at higher main magnetic field strengths, however, which require a greater distance of the radio-frequency antenna from the patient than was previously the case. This is particularly the case for interventional techniques or intervention using nuclear magnetic resonance monitoring, whereby an operator or physician requires a region of free access to the patient that is as large as possible. Due to the greater distance, attenuation of the antenna due to the patient is also thereby small, so that the losses of the antenna itself play an increasingly important role.

With superconducting coils or antennas, very high quality (Q) values can be reached, on the order of magnitude of over 100,000, i.e., the antenna losses are practical negligible. The use of loss-free antennas of this sort is thus recommended. Care must be taken, however, to ensure that the high quality is also maintained during operation. This requires an effective heat isolation against the heat radiation from the patient. In the field of cryogenics, super-insulating foils are used as a heat shield, which consist of a thin polyester film with a vapor-deposited metal layer made of aluminum. Super-insulating foils of this sort, however, cannot be used in superconducting antennas. The radio-frequency eddy currents induced in the metal layer would drastically reduce the high quality of the coil of antenna.

It is, for example, known from U.S. Pat. No. 4,636,730 to provide an antenna for a nuclear magnetic resonance apparatus with a shielding in order to keep electrical fields produced by the antenna away from the patient (Faraday shield). The shielding, however, must be transparent to form the magnetic components of the radio-frequency field. According to an embodiment disclosed in this patent, the shielding consists of strip conductors connected electrically with one another. An electrical shielding of this sort cannot be used as a heat radiation shield.

From JP-OS 6437813, a superconducting antenna is known for nuclear magnetic resonance apparatuses, which is arranged in a heat-insulating housing.

SUMMARY OF THE INVENTION

An object of the present invention is to provide a thermal insulation for a heat radiation, which is however transparent for radio-frequency electromagnetic signals in the megahertz range.

This object is achieved in accordance with the invention by a radio-frequency-transparent thermal insulating that having an electrically insulating support, on which a mosaic of electrically conductive elementary layers is arranged on at least one side. By partitioning the metal layer into very small elementary layers arranged next to one another, the power loss for the radio frequency in question is drastically reduced, while at the same time the thermal reflection is not significantly degraded. The allowable radio-frequency losses determine the size of the electrically conductive elementary layers.

According to an embodiment of the invention, a good thermal insulating effect with low radio-frequency losses is achieved wherein the elementary layers have a thickness that is approximately equal to skin depth at the heat radiation maximum. The power loss in the electrically conductive elementary layers becomes lower as the layer thickness is made thinner, but the thermal insulation effect likewise becomes smaller as the layers become thinner.

The support can be fashioned as foil or film, which causes the thermal conductivity transverse to the surface to be reduced.

In a further embodiment, the insulating bearer foil is a polyester film. Foils of this type are preferred electrical insulators and exhibit only small dielectric losses. In addition, they can be metallized well without special pre-processing.

A particularly advantageous use of the radio-frequency-transparent thermal insulation is in a high-temperature-superconducting nuclear magnetic resonance antenna arranged in a Dewar, the insulation in the Dewar being arranged between a wall of the Dewar and the antenna. The thermal insulation shields the body heat radiated by a patient from the high-temperature-superconducting nuclear magnetic resonance antenna, so that the quality of the nuclear magnetic resonance antenna is degraded only insignificantly. Given a quality of the nuclear magnetic resonance antenna of the order of magnitude of $10^5$, the partial quality related to the shielding losses should be higher by one order of magnitude, thus about $10^6$, i.e., the losses in the heat radiation shield should amount to about 10% of the overall losses of the antenna at most.

In order to increase the thermal insulation effect, in a further application of the thermal insulation several foils are arranged over each other between the nuclear magnetic resonance antenna and the wall in the Dewar vessel. The individual layers are electrically insulated from one another in case of one-sided metallization.

The insulation or the insulations can be mounted at the respective projecting points at its periphery.

DESCRIPTION OF THE PREFERRED EMBODIMENTS

Figure 1:
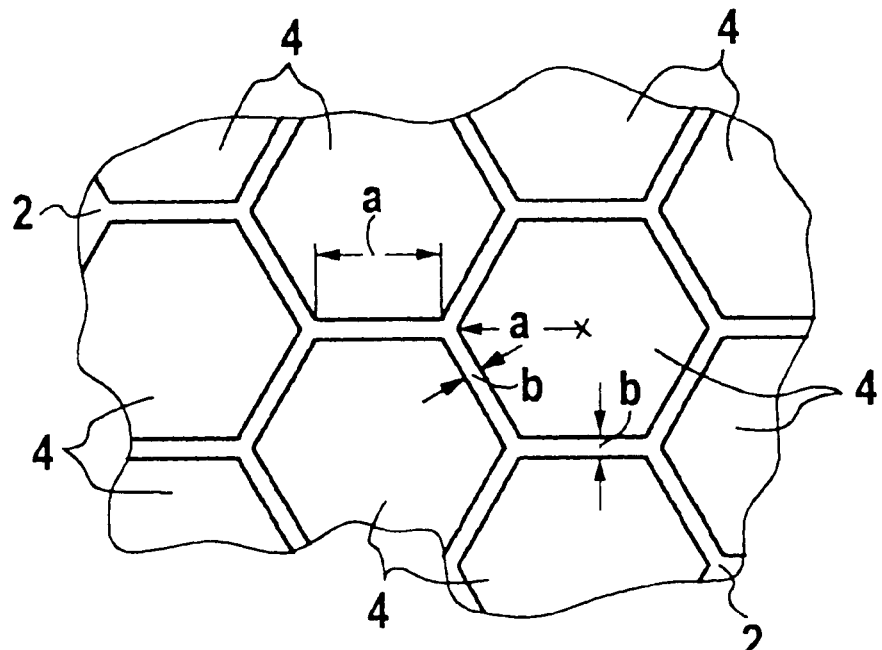
FIG. 1 shows a top view of a heat radiation shield in accordance with the invention formed by a mosaic of electrically conductive elementary layers on an insulating support.

FIG. 1 shows a section of a thermal insulation or heat radiation shield 1. A mosaic of electrically conductive elementary layers 4 is arranged on one side on an electrically insulating support 2 in the form of a polyester foil or polyester film. The polyester foil is manufactured from polyethyleneterephthalate (PETP) and is available from the DuPont company under the trade name Mylar®. The elementary layers 4, which are of equal size and are constructed as regular hexagons, are arranged in a regular grid. The elementary layers 4 are made of aluminum or gold sputtered or vapor-deposited onto the foil surface, and have a uniform thickness of about 10 nm. The edge length of the elementary layers a is about 50 μm, and the gap width b between the individual elementary layers is about 10 μm.

A degree of coverage of the mosaic on the electrically insulating support 2 of about 80% thereby results.

The thickness of the aluminum layer vapor-deposited as an elementary layer 4 is about 10 nm, and corresponds to the skin depth at a heat radiation maximum in the infrared region. In an application as a thermal insulation in a high-temperature-superconducting antenna for a 0.2 T nuclear magnetic resonance system, at a signal frequency of 8 megahertz and an antenna inductance of 40 nH, a partial quality of about $3 \times 10^6$ results. Given an inherent antenna quality of about $10^5$, several such shields 1 can be laid on top of one another, without significantly degrading the antenna quality.

Figure 2:
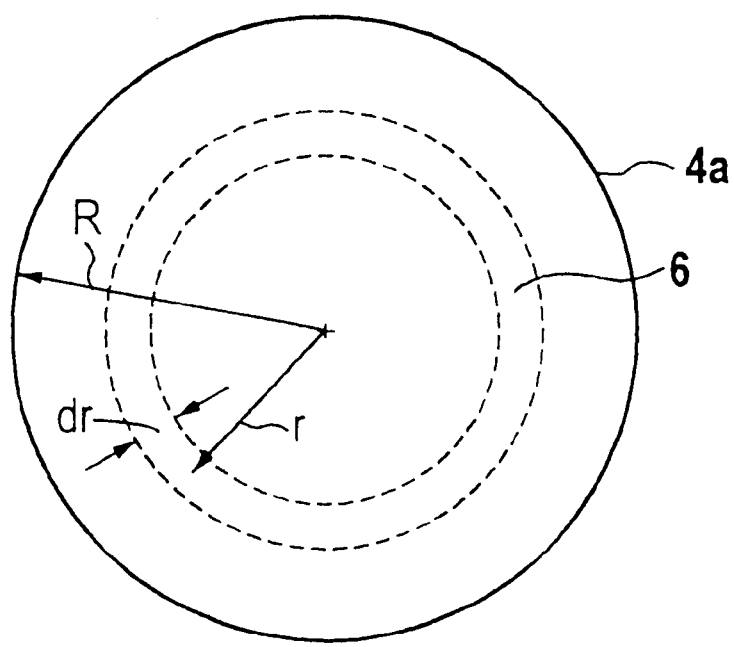
FIG. 2 shows a top view of a model of an elementary layer in the inventive heat radiation shield.

FIG. 2 shows a simplified model for explaining the dimensioning of the individual elementary layers 4. For a simpler analytical view, FIG. 2 shows a circular electrically conductive elementary layer 4a with radius R in place of a hexagonal elementary layer. The mosaic is formed by a total of N×N elementary layers 4a of this sort. For the quality, in general the following holds (ω=circuit frequency).

$$Q = \omega (\text{stored energy})/(\text{power loss}),$$

The stored magnetic field energy is defined by the antenna inductance L and the antenna current 1, as $\frac{1}{2}Ll^2$, wherein L stands for the antenna inductance and l stands for the antenna current.

The calculation of the power loss is based on the elementary layer 4a, whereby the voltage $U_i$, induced along a circuit ring with an average radius R, results as follows from the change of the magnetic field B:

$$U_i = \omega \pi r^2 B.$$

The ohmic resistance in the ring amounts to $$\rho \frac{2\pi r}{dr\, d},$$

whereby ρ is the resistivity, dr is the width of the circuit ring and d is the thickness of the metallic layer.

The power loss per elementary layer 4a is $$P = \frac{1}{8} \pi B^2 \omega^2 \frac{d}{\rho} R^4$$

For B the following is assumed as an approximation: $B = \mu_o \cdot 1/2 R_{antenna}$, wherein $R_{antenna}$ stands for the radium of an antenna with circular windings.

From the power loss and the stored field energy, the quality of the thermal insulation is then determined (with $R_{antenna} \approx N.R$) as $$Q_1 = \frac{16}{\pi} \cdot \frac{\rho \cdot L}{\omega \mu_o^2 d\, R^2}$$

wherein $\mu_o$ is the permeability of the empty chamber.

The radius of the elementary layer 4a can be determined therefrom as follows.

$$R \leq 4 \sqrt{\frac{\rho \cdot L}{\pi \cdot \omega \cdot Q \cdot \mu_o^2 \cdot d}}$$

Since the quality of a thermal insulation with n layers is intended to be approximately 10 times as large as the antenna quality $Q_{antenna}$, the following results for the radius of the elementary layer 4.

$$R \leq \sqrt{\frac{\rho \cdot L}{f \cdot \mu_o^2 \cdot d \cdot n \cdot 10 Q_{antenna}}}.$$

Figure 3:
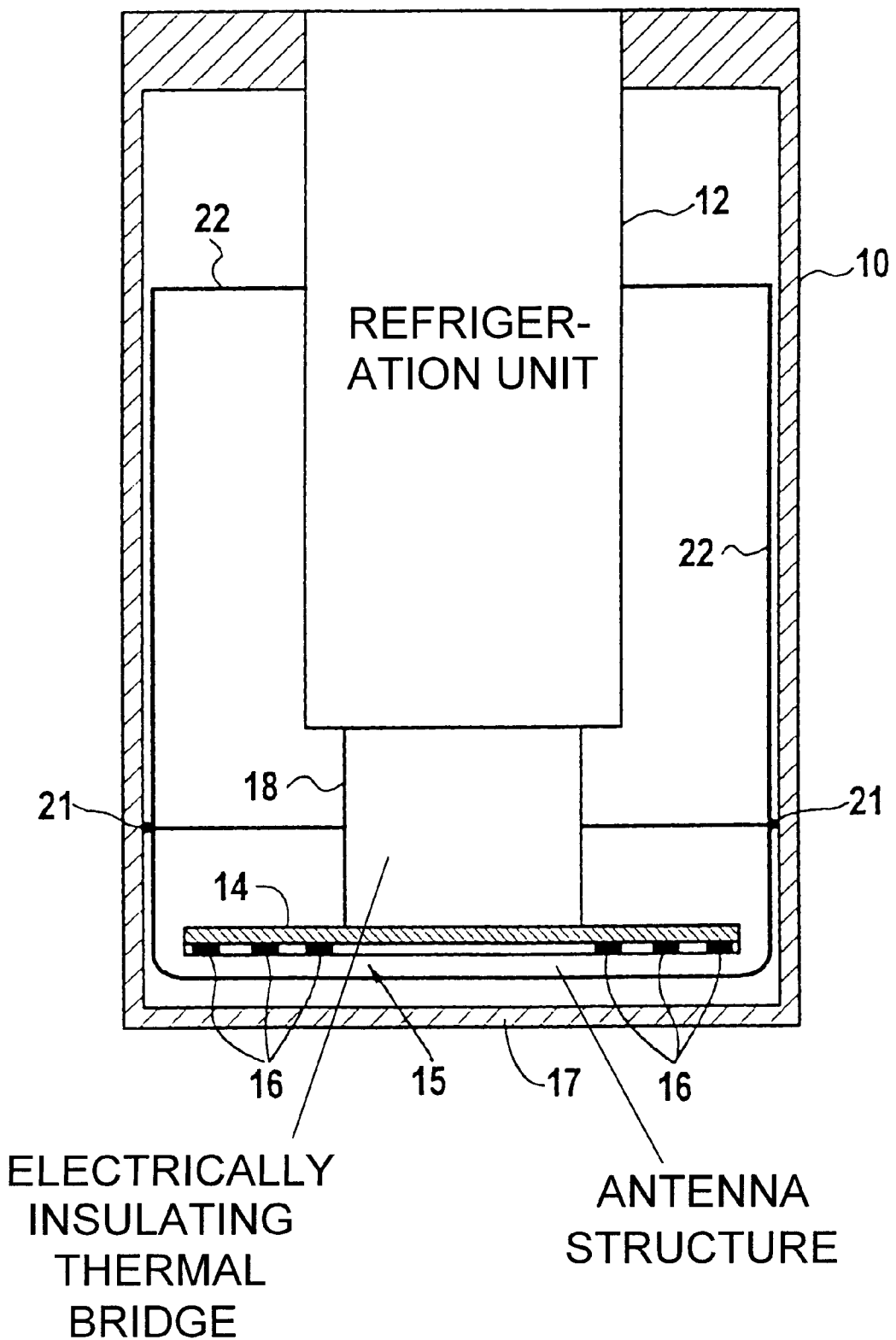
FIG. 3 shows, in a sectional view, a high-temperature-superconducting antenna arrangement for a nuclear magnetic resonance apparatus with a thermal insulation constructed in accordance with the invention.

FIG. 3 shows a sectional view of the principle of the construction of a high-temperature-superconducting antenna arrangement for a diagnostic nuclear magnetic resonance apparatus. A refrigeration unit 12 is located in a cylindrical evacuated container 10 or (a Dewar), made of an electrically non-conductive and non-magnetic material. A high-temperature-superconducting antenna structure 15 is attached on one side of a heat-conducting support plate 14. The antenna structure 15 has three windings 16 arranged in spiral form in one plane. The support plate 14 with the antenna structure 15 is arranged as closely as possible and parallel to a frontal wall 17 of the vacuum container 10. During operation of the antenna, the part to be examined of a patient is located at a certain distance in the axial direction from the frontal wall 17. The support plate 14 is coupled with a refrigeration head 20 of the refrigeration unit 12 via an electrically insulating thermal bridge 18. The foil-type thermal insulation 1, already described on the basis of FIG. 1, is arranged between the frontal wall 17 of the vacuum container 10 and the antenna structure 15. The foil 1 has lateral projections, and is fixed, e.g. glued, at some points 21 on its edge to the inner wall of the vacuum container 10. A super-insulating foil 22 with a continuous vapor-deposited metal layer, arranged further up in the axial direction, likewise shields the interior space of the vacuum container 10 against heat radiation. Due to its large distance from the antenna structure 15, the super-insulating foil 22 no longer has any adverse effect on the quality of the antenna.

If a sufficient thermal insulation effect cannot be achieved with one layer of insulation 1, several layers of insulation 1 can be arranged between the antenna structure 15 and the imaging volume.

Although modifications and changes may be suggested by those skilled in the art, it is the intention of the inventors to embody within the patent warranted hereon all changes and modifications as reasonably and properly come within the scope of their contribution to the art.

We claim as our invention:

1. A heat radiation shield comprising:
   a support composed of electrically insulating material; and
   a mosaic formed by a plurality of mosaic elements respectively isolated from each other by gaps, each mosaic element comprising an electrically conductive elementary layer disposed on at least one side of said support, and said mosaic elements being disposed next to one another in a two-dimensional grid.

2. A heat radiation shield as claimed in claim 1 wherein said elementary layers in said mosaic are disposed in a regular grid on said support.

3. A heat radiation shield as claimed in claim 1 wherein each of said elementary layers is of an equal size.

4. A heat radiation shield as claimed in claim 1 wherein each of said elementary layers has a thickness which is substantially equal to a skin depth at a maximum of heat radiation to be shielded.

5. A heat radiation shield as claimed in claim 1 wherein each of said elementary layers contains a metal.

6. A heat radiation shield as claimed in claim 1 wherein said metal comprises a metal selected from the group consisting of aluminum and gold.

7. A heat radiation shield as claimed in claim 1 wherein said support comprises a foil.

8. A heat radiation shield as claimed in claim 1 wherein said support comprises a film.

9. A heat radiation shield as claimed in claim 1 wherein said support comprises a plastic foil.

10. A heat radiation shield as claimed in claim 9 wherein said plastic foil is comprised of a polyester film.

11. A Dewar comprising:

a Dewar vessel having an exterior wall;

a high-temperature superconductive nuclear magnetic resonance antenna contained in said Dewar vessel; and a heat radiation shield contained in said Dewar vessel between said antenna and said wall, said heat radiation shield comprising an electrically insulating support and a mosaic formed by a plurality of mosaic element, respectively isolated from each other by gaps, each mosaic element comprising an electrically conductive elementary layer disposed on at least one side of said support, and said mosaic elements being disposed next to one another in a two-dimensional grid.

12. A Dewar as claimed in claim 11 wherein said heat radiation shield comprises a first radiation shield, and said Dewar comprising a plurality of additional heat radiation shields, each constructed identically to said first heat radiation shield and being disposed between said antenna and said wall, said first heat radiation shield and said plurality of additional heat radiation shields overlapping each other.

13. A Dewar as claimed in claim 11 wherein said heat radiation shield has a periphery with a plurality of point contacts disposed at said periphery, and wherein said heat radiation shield is attached to said wall exclusively at said point contacts.

* * * * *